US009029961B2

(12) United States Patent
Chang et al.

(10) Patent No.: US 9,029,961 B2
(45) Date of Patent: May 12, 2015

(54) WAFER LEVEL METHOD OF SEALING DIFFERENT PRESSURE LEVELS FOR MEMS SENSORS

(71) Applicant: Taiwan Semiconductor Manufacturing Co., Ltd., Hsin-Chu (TW)

(72) Inventors: Kuei-Sung Chang, Kaohsiung (TW); Chia-Hua Chu, Zhubei (TW); Yu-Chia Liu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/013,155

(22) Filed: Aug. 29, 2013

(65) Prior Publication Data

US 2015/0061046 A1    Mar. 5, 2015

(51) Int. Cl.
 *B81B 7/02*  (2006.01)
 *B81B 7/04*  (2006.01)
 *B81B 7/00*  (2006.01)
 *B81C 1/00*  (2006.01)

(52) U.S. Cl.
 CPC ............... *B81B 7/04* (2013.01); *B81B 7/0041* (2013.01); *B81C 1/00214* (2013.01); *B81C 1/00269* (2013.01)

(58) Field of Classification Search
 CPC .... B81B 7/02; B81C 2203/019; B81C 1/0023
 USPC ............................ 257/415, E29.324, E21.002
 See application file for complete search history.

(56) References Cited

U.S. PATENT DOCUMENTS

| 8,580,594 | B2 | 11/2013 | Huang et al. | |
| 2011/0215435 | A1* | 9/2011 | Wakimoto et al. | 257/504 |
| 2012/0043627 | A1 | 2/2012 | Lin et al. | |
| 2012/0326248 | A1* | 12/2012 | Daneman et al. | 257/415 |
| 2013/0001710 | A1 | 1/2013 | Daneman et al. | |
| 2013/0037891 | A1 | 2/2013 | Huang et al. | |
| 2013/0099355 | A1 | 4/2013 | Liu et al. | |
| 2013/0277770 | A1 | 10/2013 | Tsai et al. | |
| 2014/0103461 | A1 | 4/2014 | Chu et al. | |

(Continued)

OTHER PUBLICATIONS

U.S. Appl. No. 14/041,298, filed Sep. 30, 2013. 34 Pages.
Non Final Office Action Dated Oct. 6, 2014 U.S. Appl. No. 14/041,298.
U.S. Appl. No. 14/557,513, filed Dec. 2, 2014.

(Continued)

*Primary Examiner* — Roy Potter
*Assistant Examiner* — Paul Patton
(74) *Attorney, Agent, or Firm* — Eschweiler & Associates, LLC

(57) ABSTRACT

The present disclosure relates to a method of forming a plurality of MEMs device having a plurality of chambers with different pressures on a substrate, and an associated apparatus. In some embodiments, the method is performed by providing a device wafer having a plurality of microelectromechanical system (MEMs) devices. A cap wafer is bonded onto the device wafer in a first ambient environment having a first pressure. The bonding forms a plurality of chambers abutting the plurality of MEMs devices, which are held at the first pressure. One or more openings are formed in one or more of the plurality of chambers. The one or more openings in the one or more of the plurality of chambers are then sealed in a different ambient environment having a different pressure, thereby causing the one or more of the plurality of chambers to be held at the different pressure.

20 Claims, 7 Drawing Sheets

(56) References Cited

U.S. PATENT DOCUMENTS

2014/0225206 A1  8/2014  Lin et al.
2014/0248730 A1  9/2014  Huang et al.

OTHER PUBLICATIONS

U.S. Appl. No. 14/629,738, filed Feb. 24, 2015.
Notice of Allowance Dated Jan. 22, 2015 U.S. Appl. No. 14/041,298.

* cited by examiner

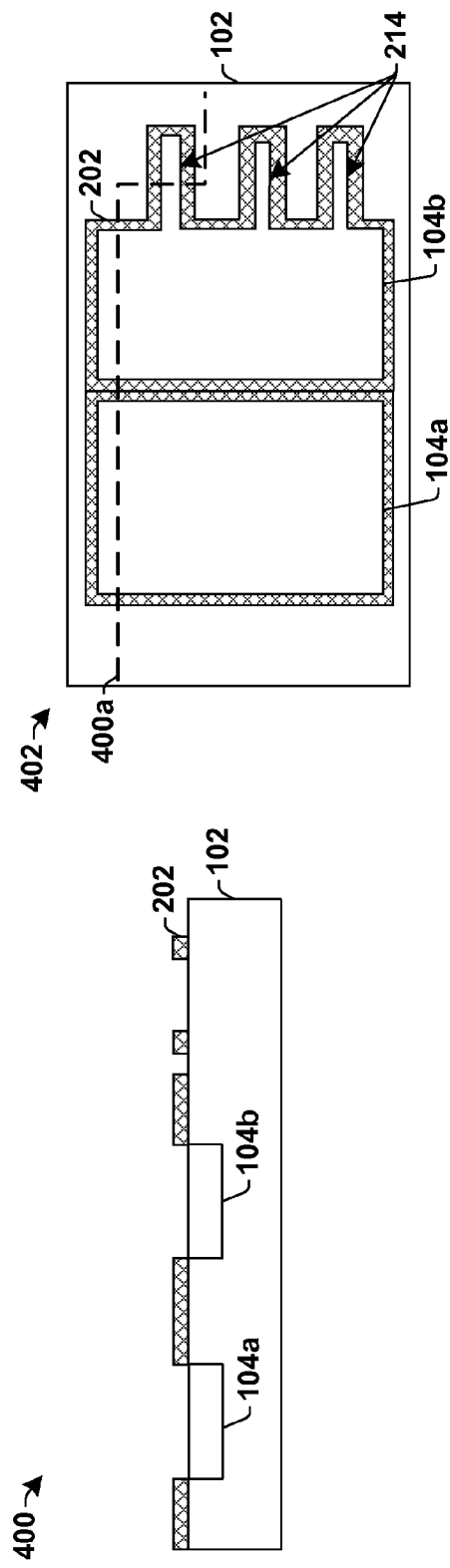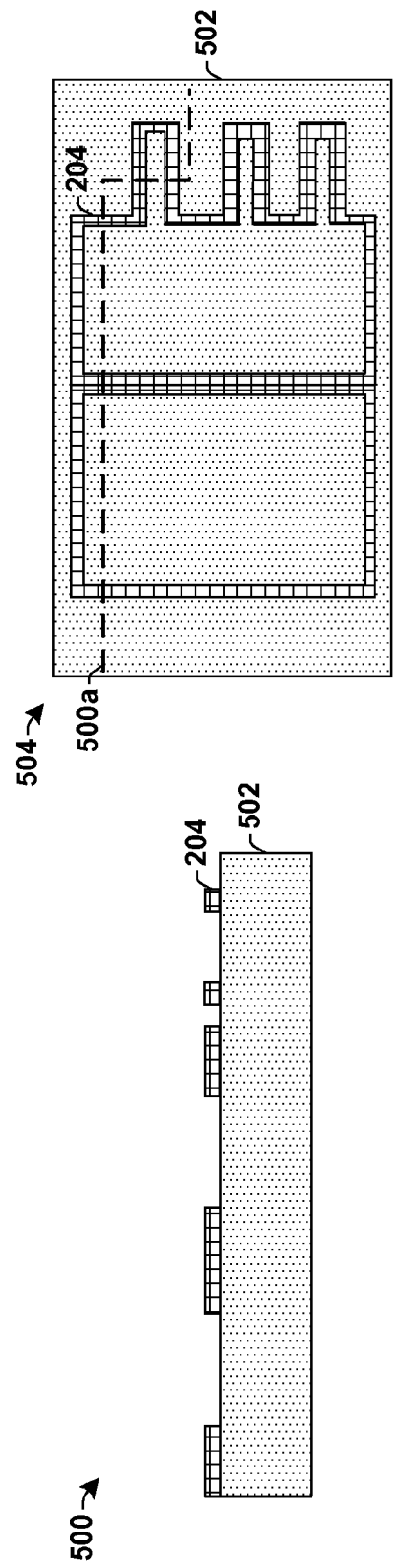

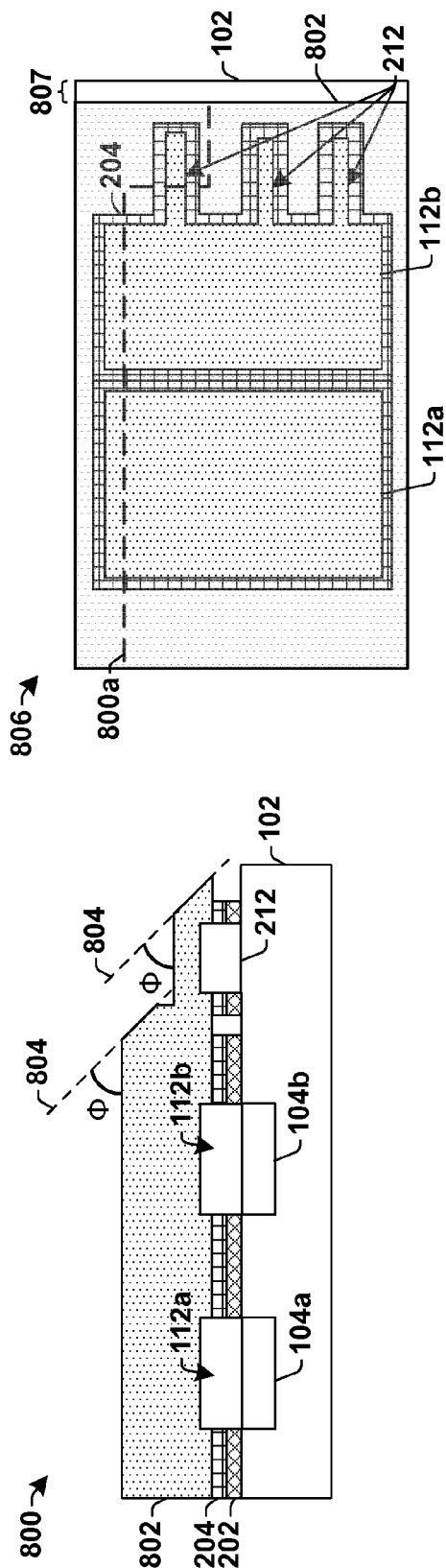
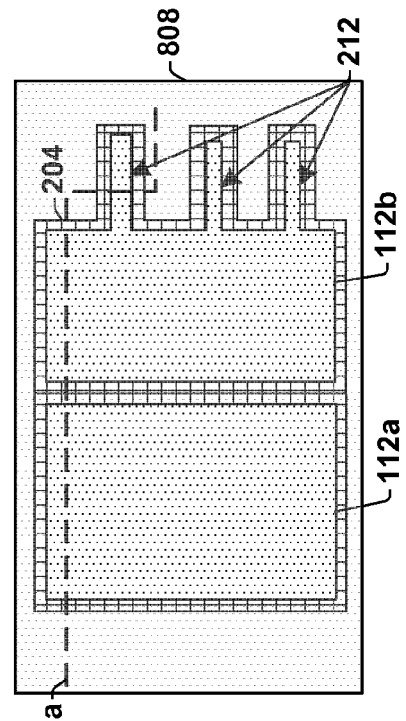
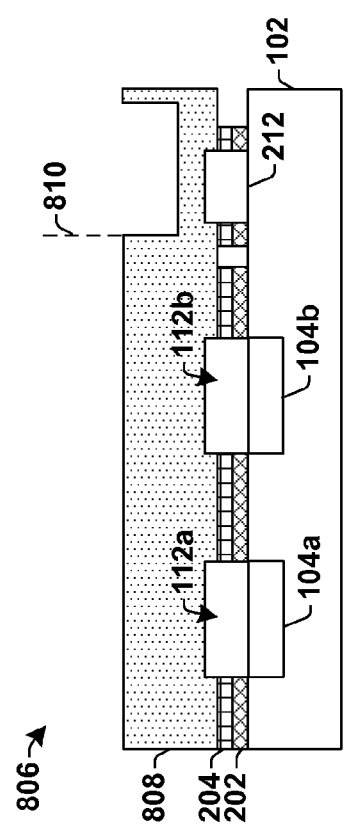
Fig. 8A
Fig. 8B

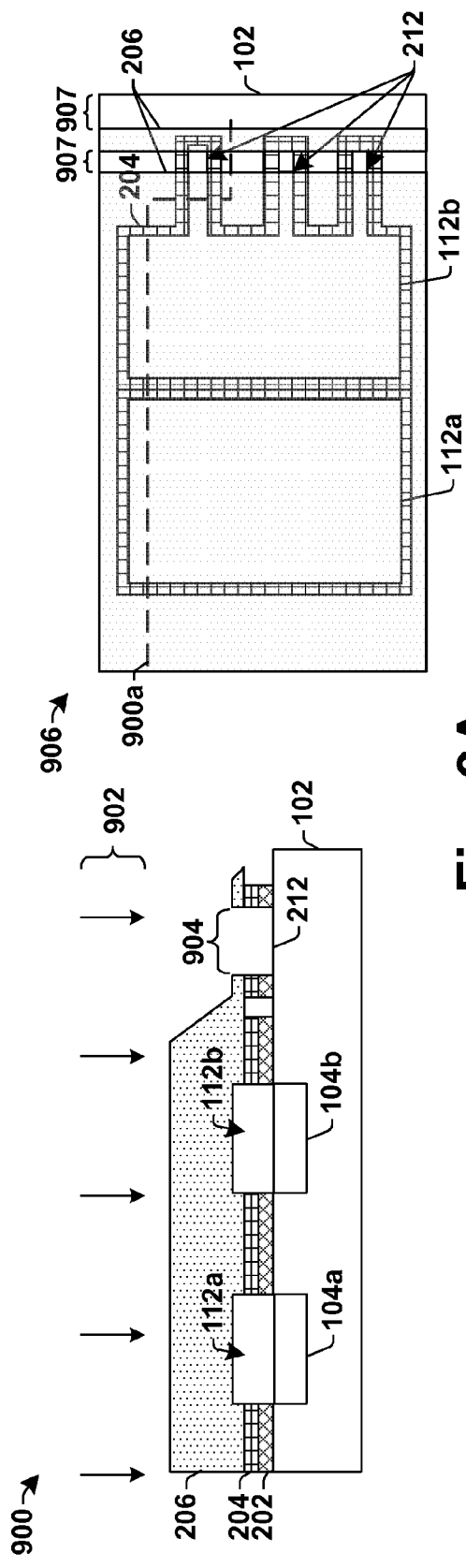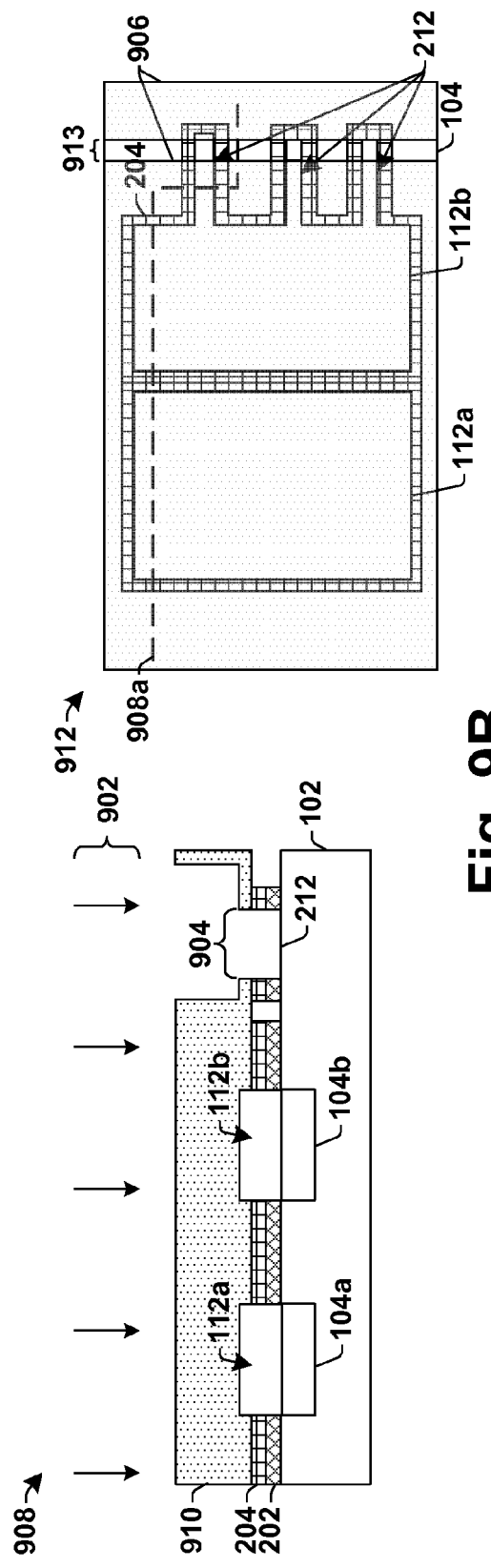

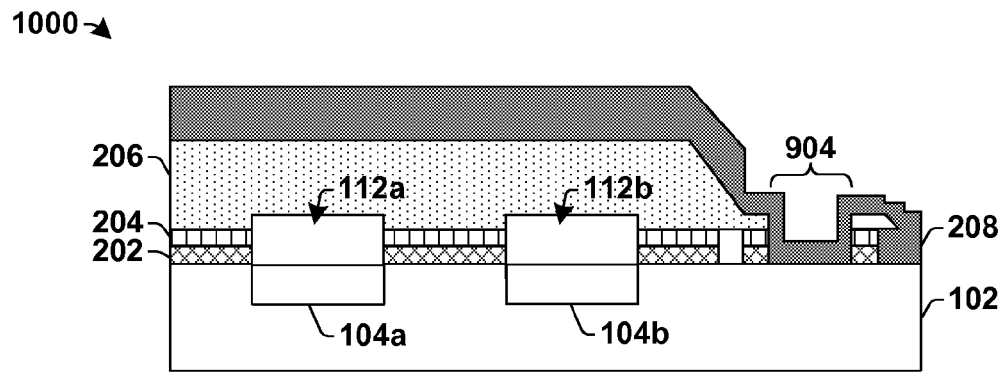
Fig. 10
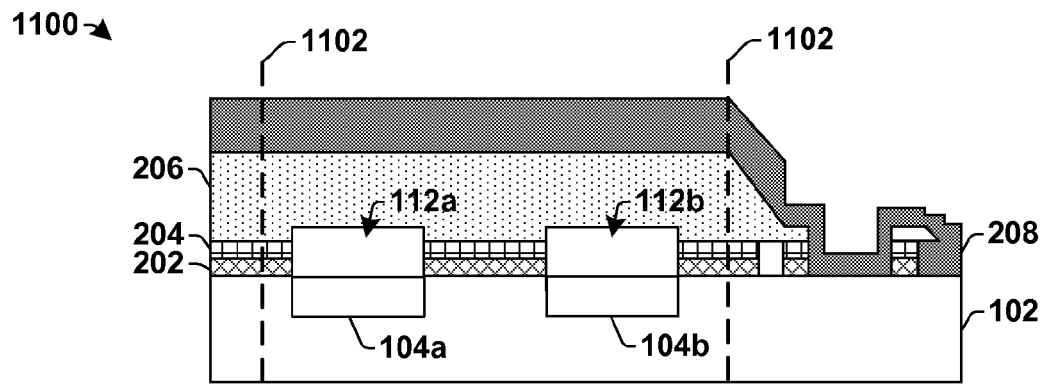
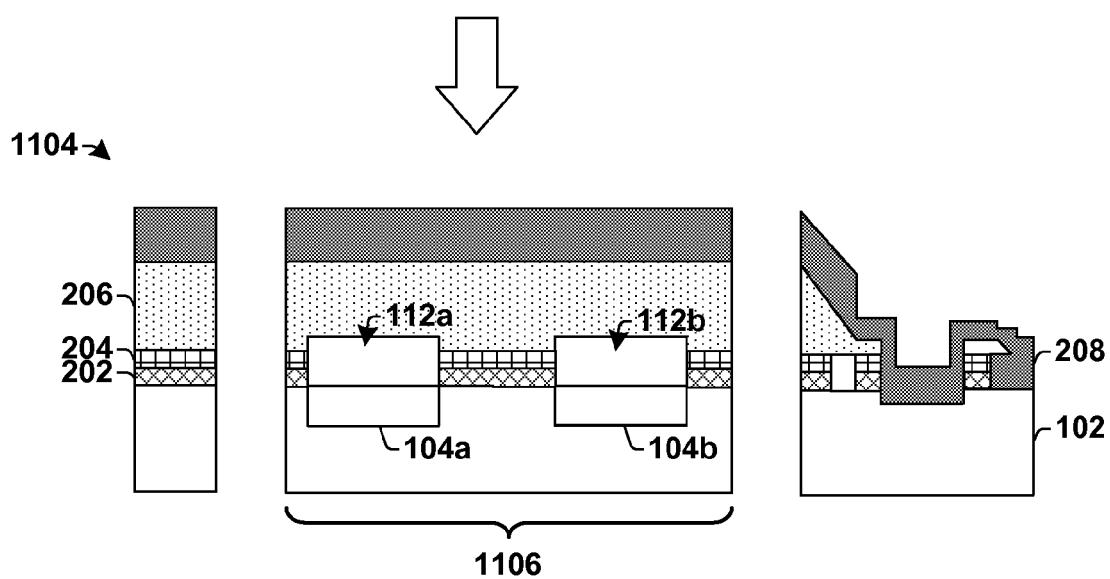
Fig. 11

WAFER LEVEL METHOD OF SEALING DIFFERENT PRESSURE LEVELS FOR MEMS SENSORS

BACKGROUND

MEMs (microelectromechanical system) devices, such as accelerometers, pressure sensors, gyroscopes, etc., have found widespread using in many modern day electronic devices. For example, MEMS accelerometers are commonly found in automobiles (e.g., in airbag deployment systems), tablet computers, or in smart phones In recent years, it is increasingly common for Micro-Electro-Mechanical Systems (MEMS) to be incorporated into integrated chips formed by a complementary metal-oxide-semiconductor (CMOS) process. The incorporation of MEMS (e.g., sensors, integrated optics, biochips, etc.) into a CMOS process allows for widespread use of MEMS fabricated with a high throughput.

BRIEF DESCRIPTION OF THE DRAWINGS

FIGS. 4-11 illustrate some embodiments of a substrate upon which a method forming a plurality of MEMs device having chambers with different pressures on a substrate, is performed

DETAILED DESCRIPTION

Figure 1:
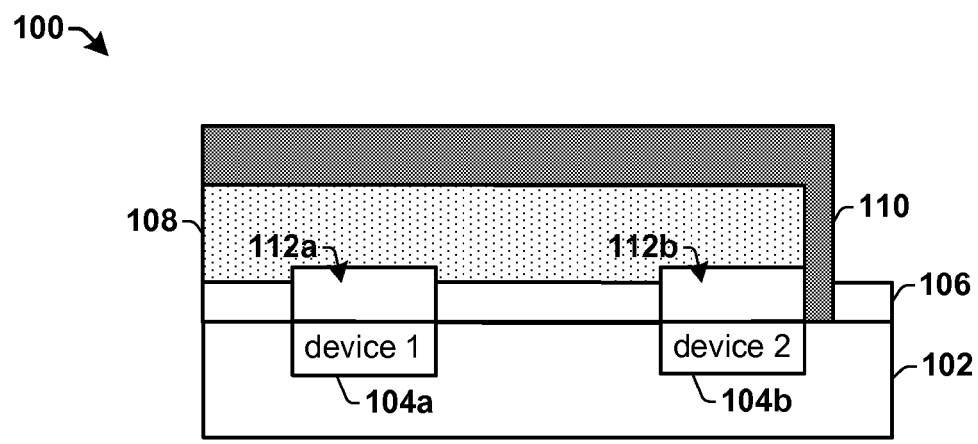
FIG. 1 illustrates a cross-sectional view of some embodiments of a substrate comprising two MEMS (microelectromechanical system) devices having chambers with different pressures.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

MEMS sensor devices often operate by sensing a characteristic of an environment surrounding the device. For example, to measure an angular momentum, a MEMS vibrational gyroscope may measure an angular rate by utilizing the Coriolis effect. To improve operation of a MEMS device, it may be desirable to operate at a specific pressure that enables improved measurement of a desired parameter. For example, in the case of a MEMs vibrational gyroscope, a lower pressure (i.e., a higher vacuum) provides for a better measurement since it mitigates background noise.

Therefore, MEMS devices typically have a hermetically-sealed chamber that is held at a controlled pressure level that enables operation of the device. The pressure level can range from a vacuum (e.g., 1 mtorr) to a few atmosphere (e.g., 2 atm) depending on device operation. When there is one MEMs device (e.g., an accelerometer) on a wafer, a wafer level method can be used to form the cavity under a pressure. However, when there are a plurality of different types of devices on a same wafer (e.g., an accelerometer and gyro) the wafer level method is unable to package the devices with separate pressures.

Accordingly, the present disclosure relates to a method of forming a plurality of MEMs devices respectively having chambers with different pressures on a substrate, and an associated apparatus. In some embodiments, the method comprises providing a device wafer having a plurality of microelectromechanical system (MEMs) devices. A cap wafer is bonded onto the device wafer in a first ambient environment having a first pressure. The bonding forms a plurality of chambers abutting the plurality of MEMs devices. One or more openings are formed in one or more of the plurality of chambers. The one or more openings expose the one or more of the plurality of chambers to a different ambient environment having a different pressure. The one or more openings are then sealed, so that the second chamber is held at the different pressure. The resulting substrate comprises a first chamber having a first pressure and a second chamber having a different pressure.

FIG. 1 illustrates a block diagram of some embodiments of a substrate 100 comprising a plurality of MEMs devices, 104a and 104b, having chambers, 112a and 112b, with different pressures.

The substrate 100 comprises a device wafer 102 having a plurality of MEMs (Microelectromechanical systems) devices, 104a and 104b, embedded therein. In some embodiments, one or more of the MEMS devices, 104a and 104b, may comprise a MEMs gyroscope (e.g., a vibrating gyroscope or a piezoelectric plate gyroscope) a MEMs accelerometer, or a MEMs pressure sensor.

A cap wafer 108 is disposed at a position overlaying the device wafer 102. The cap wafer 108 is affixed to the device wafer 102 by way of a bonding layer 106. The cap wafer 108 comprises a plurality of depressions that are positioned at locations that correspond to locations of the MEMs devices, 104a and 104b, so as to form chambers, 112a and 112b, that abut the MEMs devices, 104a and 104b.

For example, in some embodiments, the first MEMs device 104a abuts a first chamber 112a and the second MEMs device 104b abuts a second chamber 112b. The first chamber 112a is held at a first pressure. The first chamber 112a is defined in terms of the cap wafer 108, the bonding layer 106, and the device wafer 102. For example, in some embodiments, the first chamber 112a may comprise a top surface comprising the cap wafer 108 and sidewalls comprising the cap wafer 108 and the bonding layer 106.

The second chamber 112b is held at a second pressure different than the first pressure. The second chamber 112b is defined in terms of the cap wafer 108, the bonding layer 106, the device wafer 102, and a sealant 110. For example, in some embodiments, the sealant 110 is disposed to overlay the cap wafer 108 and extend from a top of the cap wafer 108 to a position that forms an interior surface of the second chamber 112b.

It will be appreciated that although the substrate of FIG. 1 is illustrated as having two chambers, 112a and 112b, that are held at different pressures that the disclosed substrate is not limited to such a configuration. For example, in other embodiments, a disclosed substrate may comprise more than two chambers, wherein two or more of the chambers may be held at a same pressure. Furthermore, it will be appreciated that the terms cap wafer and device wafer, as used herein, are not limited to actual semiconductor wafers, but instead refer in general to any sized or shaped substrates that form chambers, 112a and 112b, as described herein. For example, the cap wafer and device wafer may comprise a section or subset of a wafer (e.g., a die).

Figure 2A:
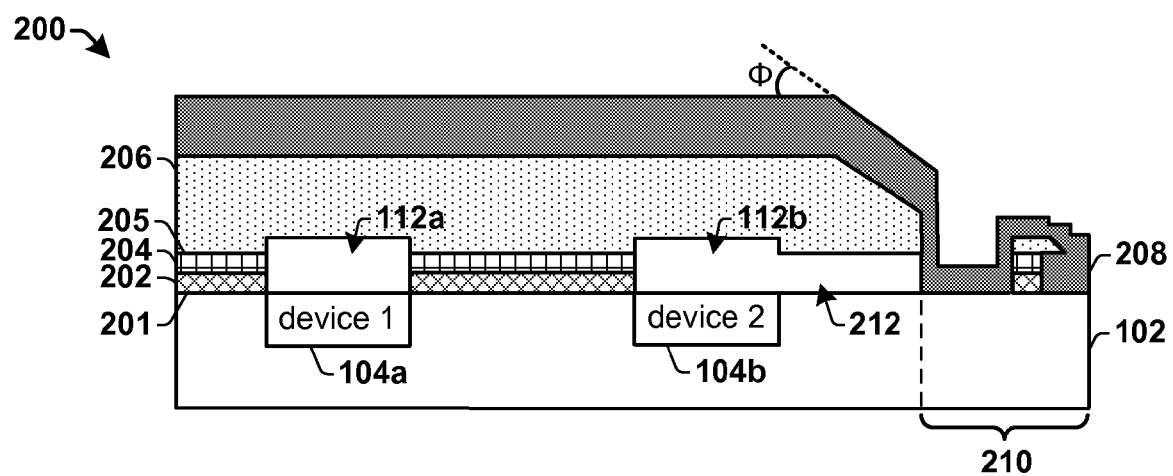
FIGS. 2A-2B illustrate some embodiments of a substrate comprising two MEMs devices having chambers with different pressures.
Figure 2B:
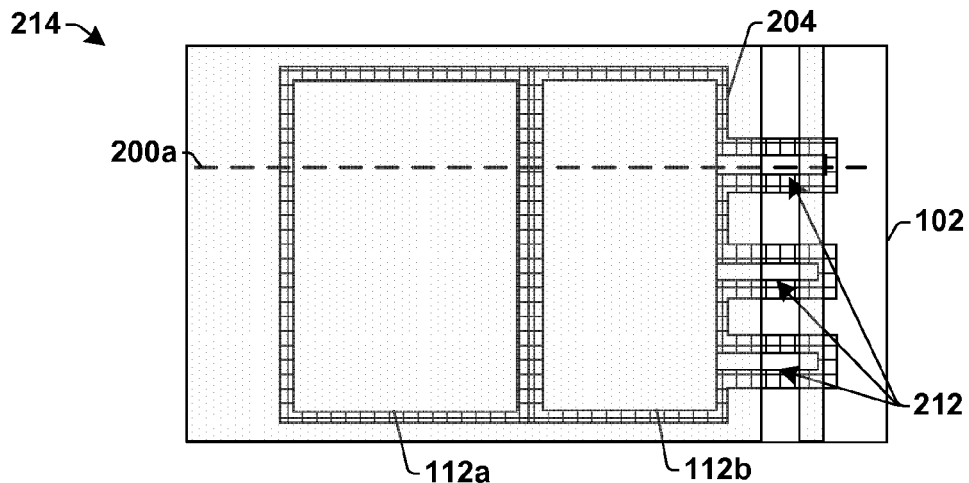

FIGS. 2A-2B illustrate some more detailed embodiments of a substrate comprising a plurality of MEMs devices having cavities with different pressures.

FIG. 2A illustrates a cross-sectional view 200 of some embodiments of a substrate comprising a plurality of MEMs devices, 104a and 104b, abutting chambers, 112a and 112b, having different pressures.

The substrate comprises a device wafer 102 having a plurality of MEMS devices, 104a and 104b. The MEMs devices, 104a and 104b, are positioned between a first layer of bonding material 202 disposed on a top surface of the device wafer 102. In some embodiments, one or more of the plurality of MEMS devices, 104a and 104b, may comprise a MEMs gyroscope such as a vibrating gyroscope or a piezoelectric plate gyroscope. In other embodiments, one or more of the plurality of MEMS devices, 104a and 104b, may comprise a MEMs accelerometer. In some embodiments, the first layer of bonding material 202 may comprise aluminum or germanium (for eutectic bond), oxide (for fusion bond), a metal or a polymer (for thermal compression bond), etc.

In some embodiments, the device wafer 102 may comprise electrical interconnections configured to couple the MEMs devices, 104a and 104b, to one or more logic devices (e.g., CMOS transistors) that make the MEMs devices, 104a and 104b, function. For example, in some embodiments, the device wafer 102 may comprise one or more stacked wafers (e.g., a 2.5D integrated chip), wherein one or more stacked wafers comprise one or more logic devices that make the MEMs devices, 104a and 104b, function.

A cap wafer 206 is located over the device wafer 102. The cap wafer 206 comprises a surface 205 that faces the top surface 201 of the device wafer 102. The surface 205 comprises a plurality of depressions that extend into the surface of the cap wafer 206 as negative reliefs. The plurality of depressions may comprise a plurality of device cavities and one or more pressure tuning cavities that extend outward from one or more of the plurality of device cavities. In some embodiments, the one or more pressure tuning cavities may comprise finger-like cavities. The one or more depressions are positioned between a second layer of bonding material 204 disposed on the surface 205 of the cap wafer 206. In some embodiments, the second layer of bonding material 204 may comprise aluminum or germanium (for eutectic bond), oxide (for fusion bond), a metal or a polymer (for thermal compression bond), etc.

The cap wafer 206 extends over a portion of the device wafer 102 that leaves an exposed area 210 of the device wafer 102 substantially uncovered by the cap wafer 206. In some embodiments, the cap wafer 206 has an angled sidewall. In some embodiments, the angled sidewall has an angle $\phi$ that is between approximately 45° and 90°.

The first and second layers of bonding material, 202 and 204, are positioned to contact one another so as to form a first chamber 112a and a second chamber 112b. The second chamber 112b is connected to one or more pressure tuning channels 212. The one or more pressure tuning channels 212 are located at a position(s) underlying the angled sidewall of the cap wafer 206.

The first MEMs device 104a abuts the first chamber 112a, which is held at a first pressure. The second MEMs device 104b abuts the second chamber 112b, which is held at a second pressure. In some embodiments, the first pressure is different than the second pressure. The different pressures of the first and second chambers, 112a and 112b, allow for MEMs devices, 104a and 104b, to comprise different types of MEMs devices. For example, in some embodiments, the first MEMs device 104a comprises an accelerometer abutting the first chamber 112a held at the first pressure, while the second MEMs device 104b comprises a gyroscope abutting the second chamber 112b held at the second pressure.

A sealant 208 is disposed over the substrate at a position that overlays the cap wafer 206 and that extends to a position within the one or more pressure tuning channels 212. In some embodiments, the sealant 208 may comprise a metal or a dielectric material.

FIG. 2B illustrates a top view 214 of some embodiments of the substrate illustrated in the cross-sectional view 200 FIG. 2A (wherein FIG. 2A is illustrated along cross-sectional line 200a).

The substrate comprises a first chamber 112a and a second chamber 112b. The first chamber 112a is surrounded by the second layer of bonding material 204. In some embodiments, the first chamber 112a is surrounded by the second layer of bonding material 204, which is disposed in a substantially rectangular pattern. The second chamber 112b is surrounded by the second layer of bonding material 204. In some embodiments, the second chamber 112b is surrounded by second layer of bonding material 204, which is disposed in a substantially rectangular pattern with pressure tuning channels 212 extending as conduits outward from the rectangular pattern (e.g., as finger-like conduits). It will be appreciated that the rectangular pattern of the second layer of bonding material 204 is a non-limiting embodiment, and that in other embodiments, the second layer of bonding material 204 may be dispensed in another, non-rectangular pattern.

The cap wafer 206 is configured to overlay the first chamber 112a and the second chamber 112b, but to expose a portion of the pressure tuning channels 212. By exposing a portion of the pressure tuning channels 212, the second chamber 112b is separated from an ambient environment through the sealant 208 (not shown).

Figure 3:
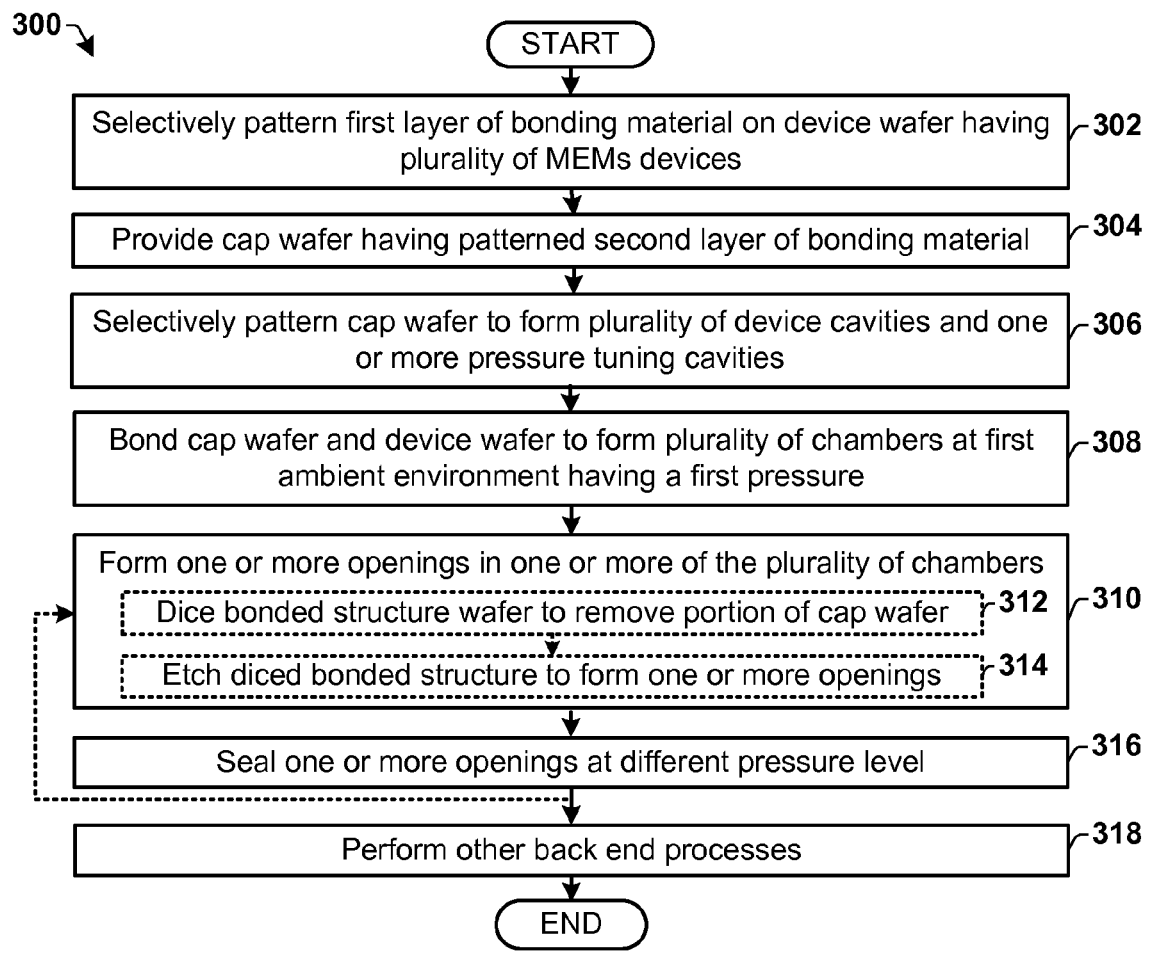
FIG. 3 illustrates a flow diagram of some embodiments of a method of forming a plurality of MEMs device having chambers with different pressures on a substrate.

FIG. 3 illustrates a flow diagram of some embodiments of a method 300 for forming a plurality of MEMs device having chambers with different pressures on a substrate.

While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a first layer of bonding material is selectively patterned on a device wafer having plurality of MEMS devices. The plurality of MEMS devices are disposed between the selectively patterned first layer of bonding material.

At 304, a cap wafer is provided having a patterned second layer of bonding material.

At 306, the cap wafer is selectively patterned to form a plurality of device cavities and one or more pressure tuning channels at positions located between the patterned second layer of bonding material.

At 308, the cap wafer is bonded to the device wafer to form a bonded wafer structure having a plurality of chambers at a first pressure. The cap wafer is bonded to the device wafer by bringing the first layer of bonding material into contact with the second layer of bonding material at a first ambient environment having the first pressure.

At 310, one or more openings are formed within one or more of the plurality of chambers. The one more openings expose the one or more of the plurality of chambers to a second ambient environment having a second pressure.

In some embodiments, the openings in the one or more of the plurality of chambers are formed by removing a portion of the cap wafer by dicing the bonded wafer structure (i.e., the cap wafer and the device wafer), at 312. In some embodiments, the bonded wafer structure is diced with a tilt dicer. The diced bonded wafer structure is then etched to form one or more openings that open the one or more of the plurality of chambers to the second ambient environment having a second pressure, at 314.

At 316, the one or more openings are sealed at a third pressure. In some embodiments the one or more chambers are sealed by depositing a sealant into the one or more openings within a third ambient environment having the third pressure. In some embodiments, the second pressure (i.e., the pressure of the second ambient environment during the opening process at 310) may be the same as the third pressure (i.e., the pressure of the ambient environment during the sealing process at 316). In other embodiments, the second pressure and the third pressure may be different.

At 318, other back end processes are performed. In some embodiments, the other back end processes may comprise dicing the substrate to form a first MEMs device on a first die and a second MEMs device on a second die. In other embodiments, the other back end processes may comprise dicing the substrate to form the first and second MEMS device on a same die. In some embodiments, the steps 310-318 may be repeated to expose other chambers at different pressures.

FIGS. 4-11 illustrate some embodiments of a substrate upon which a method forming a plurality of MEMs device having chambers with different pressures on a substrate, is performed. Although FIGS. 4-11 are described in relation to method 300, it will be appreciated that the structures disclosed in FIGS. 4-11 are not limited to such a method, but instead may stand alone as a structure.

FIG. 4 illustrates some embodiments of a cross-sectional view 400 (along cross-sectional line 400a) and a top-view 402 corresponding to act 302. As shown, a device wafer 102 is provided having a plurality of MEMS devices, 104a and 104b. In some embodiments, the device wafer 102 may comprise a silicon wafer. In some embodiments, the plurality of MEMS devices, 104a and 104b, may comprise a MEMs gyroscope, such as a vibrating gyroscope, or a MEMs accelerometer. In other embodiments, the plurality of MEMS devices, 104a and 104b, may comprise a MEMs accelerometer or a MEMs pressure sensor.

The MEMS devices, 104a and 104b, are positioned between a first layer of bonding material 202 disposed on a top surface of the device wafer 102. In some embodiments, the first layer of bonding material 202 can be aluminum or germanium for eutectic bond, oxide for fusion bond, a metal or a polymer for thermal compression bond, etc.

FIG. 5 illustrates some embodiments of a cross-sectional view 500 (along cross-sectional line 500a) and a top-view 504 corresponding to act 304. As shown in cross-sectional view 500, a second layer of bonding material 204 is selectively formed over a cap wafer 502. In some embodiments, the cap wafer 502 may comprise a silicon wafer. In some embodiments, the second layer of bonding material 204 may comprise aluminum or germanium for eutectic bond, oxide for fusion bond, a metal or a polymer for thermal compression bond, etc.

As shown in top view 504, the second layer of bonding material 204 is disposed over the cap wafer 502 in a first pattern comprising substantially rectangular pattern, and in a second pattern comprising a substantially rectangular pattern with finger-like conduits extending outward from the rectangular pattern. In other embodiments, the second layer of bonding material 204 may be disposed in first and second patterns that are non-rectangular.

Figure 6:
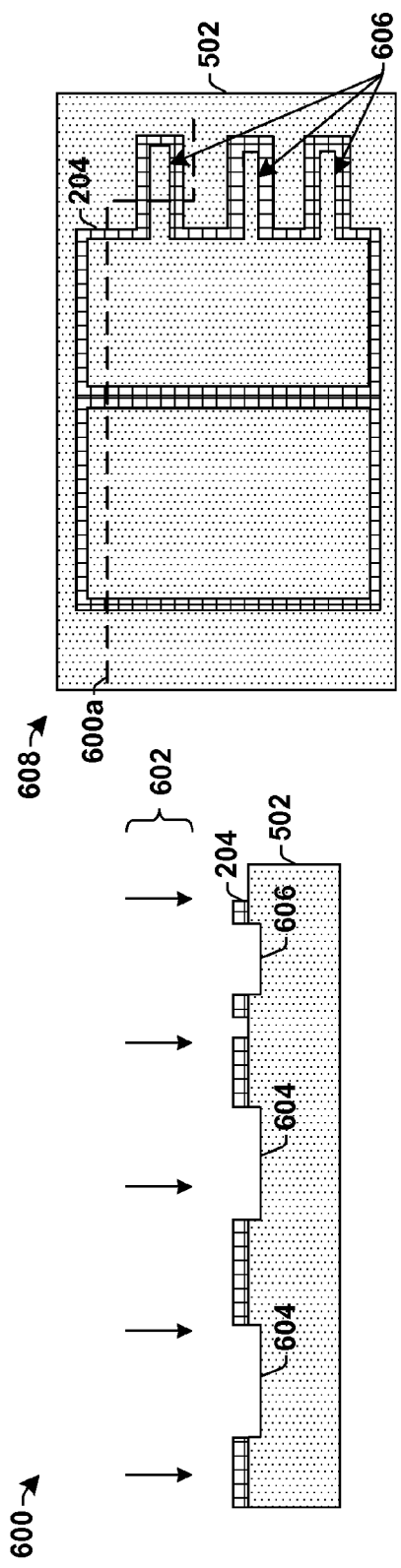

FIG. 6 illustrates some embodiments of a cross-sectional view 600 (along cross-sectional line 600a) and a top-view 608 corresponding to act 306. As shown, the cap wafer 502 is selectively patterned to form a plurality of depressions within the surface of the cap wafer 502. The plurality of depressions may comprise a plurality of device cavities 604 and one or more pressure tuning cavities 606 that extend outward from one or more of the plurality of device cavities 604. In some embodiments, the one or more pressure tuning cavities 606 may comprise finger-like cavities. In other embodiments, the one or more pressure tuning cavities 606 may comprise other shapes (e.g., non-finger-like cavities).

In some embodiments, the cap wafer 502 may be selectively patterned using a dry reactive ion etching (DRIE) process. For example, a masking layer (not shown) may be formed on to the cap wafer 502 and then the cap wafer 502 may be exposed to the dry etchant 602 that selectively removes parts of the cap wafer 502 in areas not masked by the masking layer.

Figure 7:
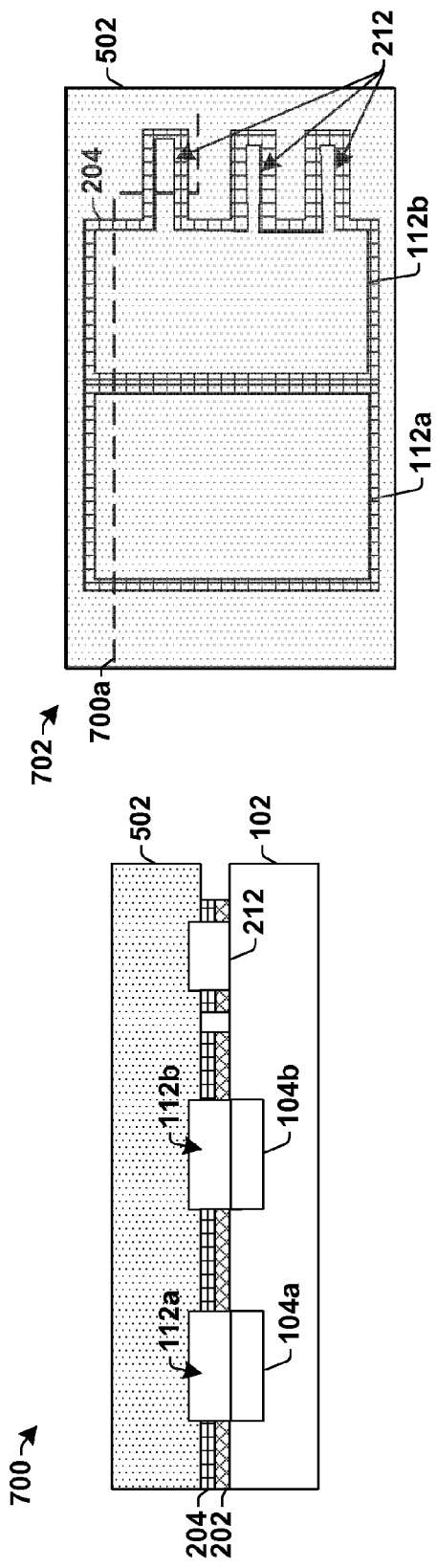

FIG. 7 illustrates some embodiments of a cross-sectional view 700 (along cross-sectional line 700a) and a top-view 702 corresponding to act 308. As shown, a cap wafer 502 is bonded to the device wafer 102 within a first ambient environment held at a first pressure to form a bonded wafer structure. The bonded wafer structure comprises a first chamber 112a, a second chamber 112b, and one or more pressure tuning channels 212, held at a first pressure. The cap wafer 502 is bonded to the device wafer 102 by bringing the first layer of bonding material 202 into contact with the second layer of bonding material 204 within the first ambient environment held at the first pressure. In some embodiments, the first pressure may be in a range of between approximately 1 millitorr (mtorr) approximately 2 atmosphere. In some embodiments, the cap wafer 502 may be bonded to the device wafer 102 by way of a fusion bonding process, an eutectic bonding process, a thermal compression bonding process, etc.

FIGS. 8A-8B illustrate various embodiments corresponding to act 312.

FIG. 8A illustrates some embodiments of a cross-sectional view 800 (along cross-sectional line 800a) and a top-view 806 corresponding to a dicing process performed with a tilt dicer. As shown, the bonded wafer structure, comprising the cap wafer 802 and the device wafer 102, is diced along scribe line 804 (note that the flat part of cap wafer 802 between angled sidewalls corresponds to vertical part of cross sectional line) by a tilt dicer having a spindle that tiled to an angle φ corresponding to a sidewall angle of cap wafer 108. In some embodiments, the angle φ is in a range of between approximately 45° and 90°. The dicing process removes a portion of the cap wafer 108, providing the cap wafer 108 with an angled sidewall overlying the one or more pressure tuning channels 212. In some embodiments, shown in top-view 806, the dicing process removes a portion of the cap wafer 802 so that an area 807 of the underlying device wafer 102 is exposed.

FIG. 8B illustrates some embodiments of a cross-sectional view 806 (along cross-sectional line 806a) and a top-view 812 corresponding to a dicing process performed with a non-tilt dicer. As shown, the bonded wafer structure, comprising the cap wafer 808 and the device wafer 102, is diced along die line 810 by a non-tilt dicer. The dicing process removes a portion of the cap wafer 808 overlying the one or more pressure tuning channels 212.

FIGS. 9A-9B illustrate various embodiments corresponding to act 314.

FIG. 9A illustrates some embodiments of a cross-sectional view 900 (along cross-sectional line 900a) and a top-view 906 corresponding to a bonded wafer structure diced with a tilt dicer (e.g., as shown in FIG. 8A). As shown, the cap wafer 206 is exposed to an etchant 902 that removes a portion of the cap wafer 108 to form one or more openings 904 that connect the one or more pressure tuning channels 212 to a second ambient environment held at a second pressure. By forming one or more openings 904 that connect the one or more pressure tuning channels 212 to the second ambient environment, the second chamber 112b is exposed the second pressure. As shown in top-view 906, the etching process removes an additional portion of the cap wafer 206 so that areas 907 of the underlying device wafer 102 are exposed.

In some embodiments, the etchant 902 may comprise a dry etchant. In some embodiments, the dry etchant may use an etching chemistry comprising chlorine ($Cl_2$) or Sulfur hexafluoride ($SF_6$), for example.

FIG. 9B illustrates some embodiments of a cross-sectional view 908 (along cross-sectional line 908a) and a top-view 912 corresponding to a bonded wafer structure diced with a non-tilt dicer (e.g., as shown in FIG. 8B). As shown, the cap wafer 910 is exposed to an etchant 902 that removes a portion of the cap wafer 910 to form one or more openings 904 that connect the one or more pressure tuning channels 212 to a second ambient environment held at a second pressure. By forming one or more openings 904 that connect the one or more pressure tuning channels 212 to the second ambient environment, the second chamber 112b is exposed the second pressure. As shown in top-view 912, the etching process removes a portion of the cap wafer 910 so that an area 913 of the underlying device wafer 102 is exposed.

FIG. 10 illustrates some embodiments of a cross-sectional view 1000 corresponding to act 316. As shown, the one or more openings 904 are sealed by depositing a sealant 208 into the one or more openings 904 within a third ambient environment having a third pressure. In some embodiments, the sealant 208 may comprise a metal or a dielectric material. In some embodiments, the sealant 208 may be deposited by way of a deposition technique (e.g., chemical vapor deposition, physical vapor deposition, etc.). In various embodiments, the second pressure and the third pressure may be the same or the second pressure and the third pressure may be different.

FIG. 11 illustrates some embodiments of cross-sectional views, 1100 and 1104, corresponding to act 318. As shown, the substrate may be diced along scribe lines 1102, using a non-tiled dicing saw, to form a single die 1106 comprising a plurality of MEMs devices, 104a and 104b, respectively abutting chambers having different pressures. For example, die 1106 comprises a first MEMs device 104a abutting a first chamber 112a having a first pressure and a second MEMs device 104b abutting a second chamber 112b having a second pressure different than the first pressure.

It will be appreciated that while reference is made throughout this document to exemplary structures in discussing aspects of methodologies described herein (e.g., the structure presented in FIGS. 4-11, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a method of forming a plurality of MEMs devices, respectively having chambers with different pressures on a substrate, and an associated apparatus.

In some embodiments, the present disclosure relates to a method of forming a plurality of MEMs device having a plurality of chambers with different pressures on a substrate. The method comprises providing a device wafer comprising a plurality of microelectromechanical system (MEMs) devices and bonding a cap wafer onto the device wafer in a first ambient environment having a first pressure, wherein the bonding forms a plurality of chambers abutting the plurality of MEMs devices. The method further comprises forming one or more openings in one or more of the plurality of chambers. The method further comprises sealing the one or more openings in the one or more of the plurality of chambers in a second ambient environment having a second pressure.

In other embodiments, the present disclosure relates to a plurality of MEMs device having a plurality of chambers with different pressures on a substrate. The method comprises selectively patterning a first layer of bonding material on a device wafer having a plurality of microelectromechanical system (MEMs) devices so that the MEMs devices are disposed between the first layer of bonding material. The method further comprises providing a cap wafer having a patterned second layer of bonding material and selectively patterning a cap wafer to form a first device cavity and a second device cavity connected to one or more pressure tuning cavities. The method further comprises bonding the cap wafer to the device wafer in a first ambient environment having a first pressure to form a first chamber and a second chamber in communication with one or more pressure tuning channels. The method further comprises dicing the cap wafer to remove a portion of the cap wafer overlying the one or more pressure tuning channels and etching the cap wafer to form one or more opening in the one or more pressure tuning channels. The method further comprises sealing the one or more openings in a second ambient environment having a second pressure different than the first pressure.

In yet other embodiments, the present disclosure relates to a substrate. The substrate comprises a device wafer having a plurality of microelectromechanical system (MEMs) devices and a bonding layer positioned over the device wafer at positions between the plurality of MEMs devices. The substrate further comprises a cap wafer comprising depressions disposed within a surface abutting the bonding layer, wherein the depressions are located at positions corresponding to the plurality of MEMs devices so as to form a plurality of chambers abutting the plurality of MEMs devices. The plurality of chambers are held at different pressures.

What is claimed is:

1. A method of forming a plurality of MEMs devices in chambers with different pressures on a substrate, comprising:
providing a device wafer comprising a plurality of microelectromechanical system (MEMs) devices;
bonding a cap wafer onto the device wafer in a first ambient environment having a first pressure, wherein the bonding forms a plurality of chambers abutting the plurality of MEMs devices and one or more pressure tuning channels vertically disposed between the device wafer and the cap wafer and laterally extending outward from a sidewall of one of the plurality of chambers;
forming one or more openings in the one or more pressure tuning channels; and
sealing the one or more openings in the one or more of the plurality of chambers in a second ambient environment having a second pressure.

2. The method of claim 1, wherein the cap wafer comprises a plurality of depressions comprising negative reliefs disposed within a surface abutting a bonding layer vertically disposed between the device wafer and the cap wafer.

3. The method of claim 1, wherein one of the one or more openings is in communication with a plurality of pressure tuning channels.

4. The method of claim 2, wherein forming one or more openings comprises:
dicing the cap wafer to remove a portion of the cap wafer; and
etching the cap wafer, on a horizontal surface of the cap wafer exposed after dicing the cap wafer, to form the one or more opening in the one or more pressure tuning channels.

5. The method of claim 4, wherein dicing the cap wafer comprises dicing the cap wafer with a tilt dicer.

6. The method of claim 5, wherein dicing the cap wafer with the tilt dicer results in an angled sidewall of the cap wafer overlying the one or more pressure tuning channels and having an angle that is between approximately 45° and 90°.

7. The method of claim 1, wherein sealing the one or more openings comprises depositing a sealant onto the substrate within the one or more openings.

8. The method of claim 1, further comprising:
dicing the substrate to form a single die comprising a first MEMs device abutting a first chamber held at the first pressure and a second MEMs device abutting a second chamber held at the second pressure.

9. A method of forming a plurality of MEMs devices, comprising:
selectively patterning a first layer of bonding material on a device wafer having a plurality of microelectromechanical system (MEMs) devices so that the MEMs devices are disposed between the first layer of bonding material;
providing a cap wafer having a patterned second layer of bonding material;
selectively patterning the cap wafer to form a first device cavity and a second device cavity connected to one or more pressure tuning cavities;
bonding the cap wafer to the device wafer in a first ambient environment having a first pressure to form a first chamber and a second chamber in communication with one or more pressure tuning channels; and
dicing the cap wafer to remove a portion of the cap wafer overlying the one or more pressure tuning channels;
etching the cap wafer, on a horizontal surface of the cap wafer exposed after dicing the cap wafer, to form one or more openings in the one or more pressure tuning channels; and
sealing the one or more openings in a second ambient environment having a second pressure different than the first pressure.

10. The method of claim 9, wherein dicing the cap wafer comprises dicing the cap wafer with a tilt dicer.

11. The method of claim 9, wherein sealing the one or more openings comprises depositing a sealant within the one or more openings.

12. A substrate, comprising:
a device wafer having a plurality of microelectromechanical system (MEMs) devices;
a bonding layer positioned over the device wafer at positions between the plurality of MEMs devices; and
a cap wafer comprising depressions disposed within a surface abutting the bonding layer;
a plurality of chambers vertically disposed between the device wafer and the cap wafer and abutting the plurality of MEMs devices, wherein the plurality of chambers are held at different pressures; and
one or more pressure tuning channels vertically disposed between the device wafer and the cap wafer and laterally extending outward from a sidewall of one of the plurality of chambers.

13. The substrate of claim 12, wherein the plurality of chambers comprise a second chamber in communication with one or more pressure tuning channels extending outward from the second chamber.

14. The substrate of claim 13, further comprising:
a sealant that extends into the one or more pressure tuning channels from a position overlying the cap wafer.

15. The substrate of claim 13, wherein the cap wafer has an angled sidewall overlaying the one or more pressure tuning channels.

16. The substrate of claim 15, the angled sidewall has an angle that is between approximately 45° and 90°.

17. The method of claim 1, wherein sidewalls of the one or more pressure tuning channels comprise the cap wafer and a bonding layer vertically disposed between the cap wafer and the device wafer.

18. The method of claim 4, wherein the device wafer laterally extends past the overlying cap wafer after dicing.

19. The substrate of claim 12, wherein sidewalls of the one or more pressure tuning channels comprise the cap wafer and a bonding layer vertically disposed between the cap wafer and the device wafer.

20. The substrate of claim 12, wherein the one or more pressure tuning channels comprise a sealant arranged within a sidewall of one of the one or more pressure tuning channels, which opposes the one of the plurality of chambers.

* * * * *